United States Patent
Vestal et al.

(10) Patent No.: US 12,068,183 B2
(45) Date of Patent: Aug. 20, 2024

(54) SUBSTRATE CONTAINER WITH DOOR GASKET

(71) Applicant: ENTEGRIS, INC., Billerica, MA (US)

(72) Inventors: Aaron Vestal, Colorado Springs, CO (US); Matthew A. Fuller, Colorado Springs, CO (US); Christopher Strickhouser, Monument, CO (US)

(73) Assignee: ENTEGRIS, INC., Billerica, MA (US)

( * ) Notice: Subject to any disclaimer, the term of this patent is extended or adjusted under 35 U.S.C. 154(b) by 130 days.

(21) Appl. No.: 17/839,208

(22) Filed: Jun. 13, 2022

(65) Prior Publication Data

US 2022/0406637 A1 Dec. 22, 2022

Related U.S. Application Data

(60) Provisional application No. 63/210,342, filed on Jun. 14, 2021.

(51) Int. Cl.
*H01L 21/673* (2006.01)

(52) U.S. Cl.
CPC .............. *H01L 21/67376* (2013.01)

(58) Field of Classification Search
CPC ......... H01L 21/67376; H01L 21/67366; H01L 21/67383; H01L 21/67386; H01L 21/67772; F16J 15/062
USPC .......................................... 206/710–712.832
See application file for complete search history.

(56) References Cited

U.S. PATENT DOCUMENTS

| | | | | |
|---|---|---|---|---|
| 6,354,601 B1 * | 3/2002 | Krampotich | ...... | H01L 21/67376 220/795 |
| 6,719,302 B2 * | 4/2004 | Andrick | ............. | F16L 25/0036 277/626 |
| 7,413,099 B2 * | 8/2008 | Takahashi | ............. | B65D 53/02 277/648 |
| 7,648,041 B2 | 1/2010 | Ueda et al. | | |
| 8,720,693 B2 * | 5/2014 | Nagashima | ....... | H01L 21/67376 206/711 |
| 8,783,694 B2 * | 7/2014 | Matsuo | .................. | F16J 15/025 277/642 |
| 9,520,310 B2 * | 12/2016 | Gregerson | ............. | B65D 85/30 |
| 10,985,043 B2 * | 4/2021 | Narita | ............... | H01L 21/67366 |
| 2006/0249512 A1 * | 11/2006 | Ueda | .................. | H01L 21/67126 220/806 |
| 2009/0261533 A1 * | 10/2009 | Inoue | ................ | H01L 21/67376 277/648 |
| 2015/0122699 A1 | 5/2015 | Gregerson et al. | | |
| 2019/0049015 A1 * | 2/2019 | Mackel | ................... | F16J 15/106 |

(Continued)

FOREIGN PATENT DOCUMENTS

JP 2005225545 A 8/2005
KR 101183027 B1 9/2012

*Primary Examiner* — Chun Hoi Cheung

(57) ABSTRACT

Gaskets for wafer containers include a seal body and a retention projection. The retention projection includes a retention segment extending from the seal body, a compression relief segment extending from the retention segment, and a bead disposed at an end of the compression relief segment. The compression relief segment has a cross-sectional width less than a cross-sectional width of the retention segment. The bead has a shape including portion having a width greater than a cross-sectional width of the gland at a corresponding depth in the gland. The gasket can be provided in a wafer container or a door of the wafer container.

18 Claims, 3 Drawing Sheets

(56) References Cited

U.S. PATENT DOCUMENTS

2020/0051844 A1* 2/2020 Bellet ............... H01L 21/67376
2020/0185244 A1* 6/2020 Ogawa ................... B65D 43/02

* cited by examiner

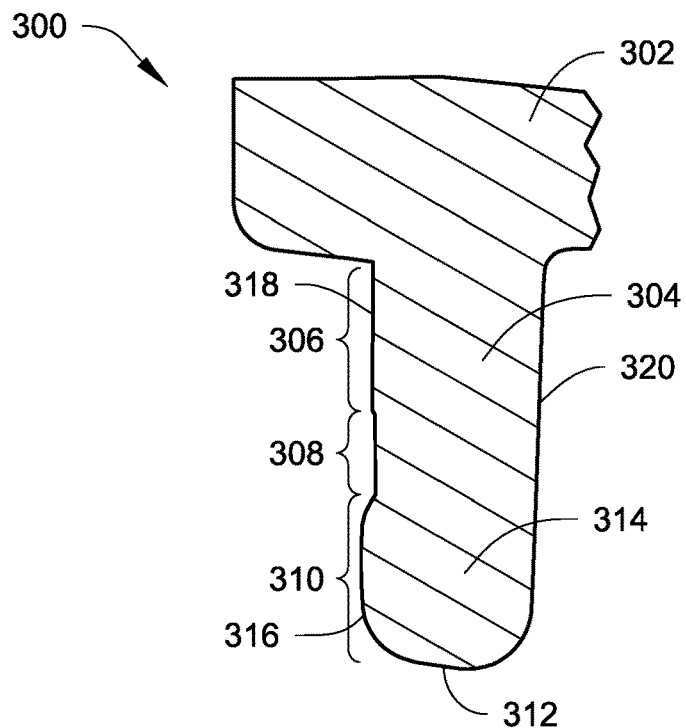
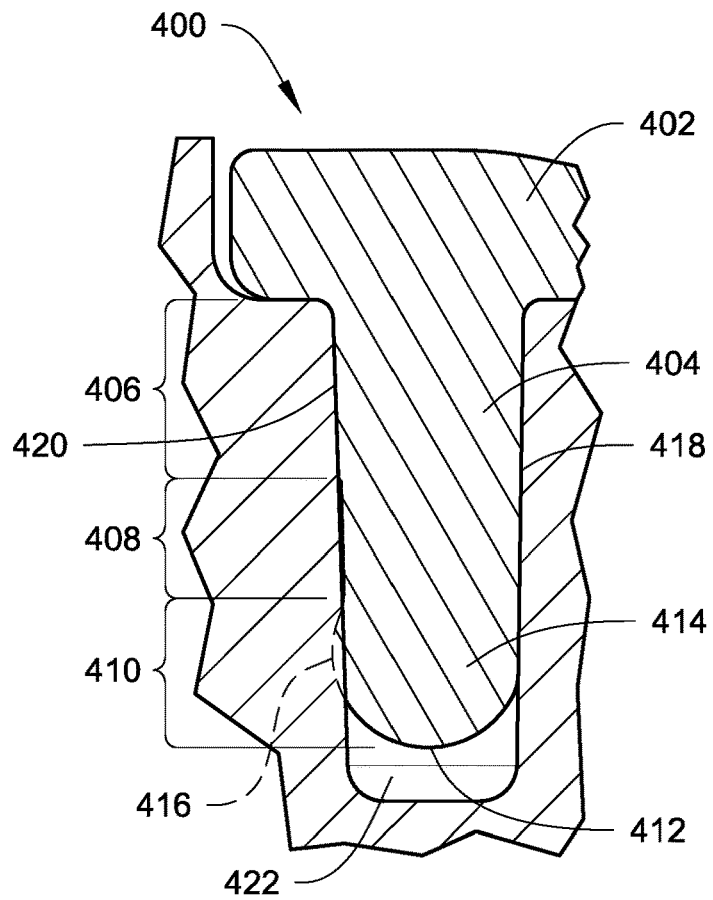

SUBSTRATE CONTAINER WITH DOOR GASKET

FIELD

This disclosure is directed to substrate containers, particularly containers including a gasket having geometry improving sealing and retention of the gasket.

BACKGROUND

Wafer containers define microenvironments for the storage and processing of wafers, such as semiconductor wafers. To define the microenvironment, wafer containers typically include an open side and a door to close off the open side. A seal can be formed between the door and the remainder of the body, such as a gasket. The gasket can be retained in a gland formed on part of the wafer container or the door.

SUMMARY

This disclosure is directed to substrate containers, particularly containers including a gasket having geometry improving sealing and retention of the gasket.

Gaskets according to embodiments provide much stronger retention force relative to the required insertion force. The gasket can therefore be secured more strongly without increasing the force required for insertion or otherwise complicating the incorporation of the gasket into the wafer container or the wafer container door. This reduces the risk of gasket slippage and ensures the quality of the seal. Gaskets according to embodiments can further provide improved sealing effectiveness.

In an embodiment, a door for a wafer container includes a door plate including a gland configured to receive a portion of a gasket and a gasket including a compressible material. The gasket includes a seal body and a retention projection. The retention projection includes a retention segment extending from the seal body. The retention segment has a cross-sectional width equal to or less than a cross-sectional width of the gland at a corresponding depth in the gland. The retention projection also includes a compression relief segment extending from the retention segment. The compression relief segment has a cross-sectional width less than a cross-sectional width of the retention segment. The retention projection further includes a bead disposed at an end of the compression relief segment. The bead has a maximum cross-sectional width greater than a cross-sectional width of the gland at a corresponding depth in the gland.

In an embodiment, the gasket has a retention force to insertion force ratio of 0.5 to 1.0, the retention force being a force required to remove the gasket from the gland, the insertion force being a force required to fully insert the retention projection into the gland.

In an embodiment, when the door is attached to a wafer container, a conductance through the door joint is less than 0.02.

In an embodiment, the retention segment forms at least one half of the length of the retention projection.

In an embodiment, the retention segment has a length that it at least twice a length of the compression relief segment.

In an embodiment, the gasket is formed of a thermoplastic elastomer having a Shore A hardness of 50-80 durometer.

In an embodiment, the cross-sectional width of the retention segment is between 5% and 15% smaller than the cross-sectional width of the gland where the retention segment meets the seal body.

In an embodiment, the cross-sectional width of the bead at a widest point is between 5% and 12% larger than the cross-sectional width of the gland at a corresponding depth in the gland.

In an embodiment, the cross-sectional width of the compression relief segment that is between 5% and 15% smaller than a cross-sectional width of the retention segment.

In an embodiment, a front opening wafer container includes a container body having an open front defined by a door frame and a door configured to be attached to the door frame. The door includes a door plate including a gland configured to receive a portion of a gasket and a gasket including a compressible material. The gasket includes a seal body and a retention projection. The retention projection includes a retention segment extending from the seal body. The retention segment has a cross-sectional width equal to or less than a cross-sectional width of the gland at a corresponding depth in the gland. The retention projection also includes a compression relief segment extending from the retention segment. The compression relief segment has a cross-sectional width less than a cross-sectional width of the retention segment. The retention projection further includes a bead disposed at an end of the compression relief segment. The bead has a maximum cross-sectional width greater than a cross-sectional width of the gland at a corresponding depth in the gland. The gasket is configured to form a seal between the door and the door frame.

In an embodiment of the wafer container, the gasket has a retention force to insertion force ratio of 0.6 to 1.0.

In an embodiment of the wafer container, the door is attached to a wafer container, a conductance through the door joint is less than 0.02.

In an embodiment of the wafer container, the retention segment forms at least one half of the length of the retention projection.

In an embodiment of the wafer container, the retention segment has a length that it at least twice a length of the compression relief segment.

In an embodiment of the wafer container, the gasket is formed of a thermoplastic elastomer having a Shore A hardness of 60 to 90 durometer.

In an embodiment of the wafer container, the cross-sectional width of the retention segment is between 5% and 15% smaller than the cross-sectional width of the gland where the retention segment meets the seal body.

In an embodiment of the wafer container, the cross-sectional width of the bead at a widest point is between 5% and 12% larger than the cross-sectional width of the gland at a corresponding depth in the gland.

In an embodiment of the wafer container, the cross-sectional width of the compression relief segment that is between 5% and 15% smaller than a cross-sectional width of the retention segment.

DRAWINGS

FIG. 3 shows a retention projection of a gasket according to an embodiment.

FIG. 4 shows a retention projection of a gasket according to an embodiment.

DETAILED DESCRIPTION

This disclosure is directed to substrate containers, particularly containers including a gasket having geometry improving sealing and retention of the gasket.

Figure 1:
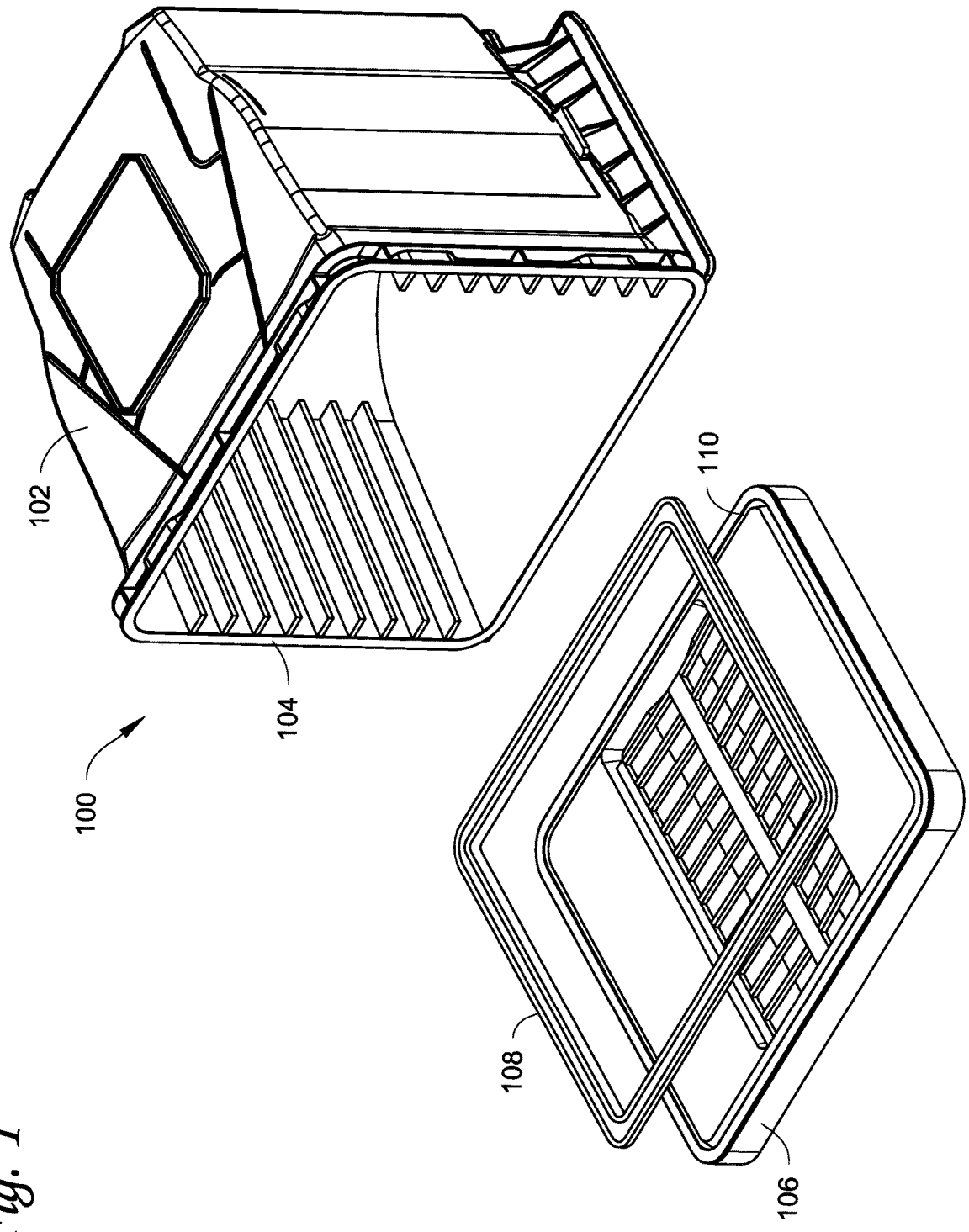
FIG. 1 shows an exploded view of a wafer container according to an embodiment.

FIG. 1 shows an exploded view of a wafer container according to an embodiment. Wafer container 100 includes container body 102 having an open end 104. Wafer container 100 also includes door 106. A gasket 108 can be used to seal where the door 106 and container body 102 meet to enclose open end 104.

Wafer container 100 is a container used the processing, transport, and/or storage of wafers, such as semiconductor wafers. Wafer container 100 can be a front opening container, for example, a front opening unified pod (FOUP). Container body 102 defines an internal space within wafer container 100, with open end 104 provided on one side of container body 102. Open end 104 can allow wafers to be placed with and/or removed from the internal space defined by container body 102. The door 106 can be used to close open end 104. When open end 104 is closed by door 106, a seal can be formed such that the internal space within wafer container 100 provides a microenvironment protected from contaminants in an environment surrounding wafer container 100. The seal can be provided by gasket 108. Gasket 108 is configured to form a seal between container body 102 and door 106 when door 106 encloses open end 104. Gasket 108 can be made of any suitable material for forming the seal, such as a polymer material. In an embodiment, gasket 108 includes a thermoplastic elastomer having a Shore A hardness of 50-80 durometer. In an embodiment, gasket 108 is formed entirely of the thermoplastic elastomer having a Shore A hardness of between approximately 50-80 durometer.

In the embodiment shown in FIG. 1, door 106 includes gland 110 formed in the surface of door 106 that faces towards container body 102 when assembled to enclose open end 104. Gland 110 is configured to retain gasket 108. Gland 110 is a groove configured to accommodate a projection from the gasket 108. In an embodiment, gland 110 tapers such that a cross-sectional width of gland 110 decreases as gland 110 extends from the surface of door 106 into the body of door 106. While gland 110 is shown as being located on door 106, it is understood that the gland can be in any suitable position for retaining gasket 108 such that it can form a seal between door 106 and container body 102, for example at the perimeter of open end 104.

Figure 2:
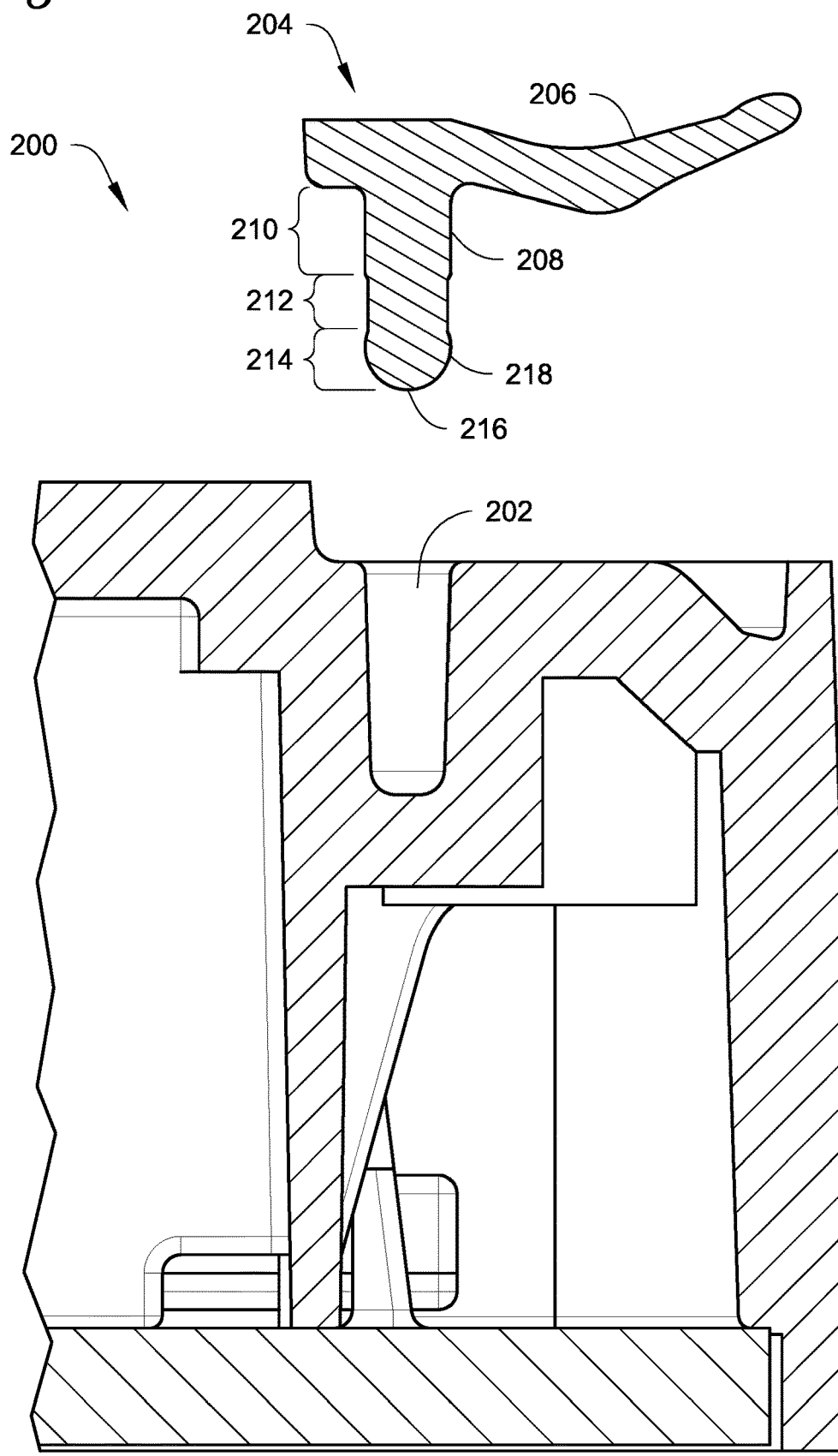
FIG. 2 shows a sectional view of a gasket and a wafer container door according to an embodiment.

FIG. 2 shows a sectional view of a gasket and a wafer container door according to an embodiment. Wafer container door 200 includes gland 202 and gasket 204. Gasket 204 includes seal body 206 and retention projection 208. Retention projection 208 includes a retention segment 210, a compression relief segment 212, and a bead 214.

Wafer container door 200 is a door configured to enclose a wafer container, such as door 106 of wafer container 100, which encloses open end 104 as shown in FIG. 1 and described above. Gland 202 is a groove formed in the wafer container door 200. In an embodiment, the sides of gland 202 are parallel to one another and the groove has a consistent width for its depth. In an embodiment, the sides of gland 202 are angled with respect to one another such that the groove has a taper in which the width of the groove diminishes with depth. The relative thicknesses of segments of the retention projection 208 can correspond to the width of gland 202 at the depth where that segment or relevant part thereof is located at when retention projection 208 is fully inserted into gland 202.

Gasket 204 is configured to provide a seal between wafer container door 200 and the corresponding wafer container (not shown) such as the wafer container 100 described above and shown in FIG. 1. Gasket 204 is configured to be retained to the wafer container door 200 by an interference fit between retention projection 208 and gland 202. Gasket 204 can be made of any suitable material for forming the seal, such as a polymer material. In an embodiment, gasket 204 includes a thermoplastic elastomer having a Shore A hardness of 50-80 durometer. In an embodiment, gasket 204 is formed entirely of the thermoplastic elastomer having a Shore A hardness of 50-80 durometer.

Seal body 206 is a portion of gasket 204 configured to be compressed between door 200 and the wafer container to form the seal. Seal body 206 can have any suitable shape and thickness for such compression. Seal body 204 can be configured to be pre-loaded by contact with wafer container door 200. In an embodiment, seal body 206 is configured such that a tip of the seal body 206 is angled away from door 200 when the gasket 204 is retained in gland 202. In an embodiment, at least a portion of seal body 206 can be angled with respect to retention projection 208 such that the portion forms an acute angle with retention projection 208.

Retention projection 208 is configured to be inserted into gland 202 to retain gasket 204 to door 200. Retention projection 208 is configured to be compressed by the walls of gland 202 over at least a segment of the retention projection 208 to provide the retaining force. The compression of the retention projection by gland 202 also can provide resistance to the insertion of the retention projection 208 into gland 202. Retention projection 208 includes retention segment 210, compression relief segment 212, and bead 214.

Retention segment 210 is the segment of retention projection 208 that joins seal body 206. At seal body 206, retention segment 210 can have a cross-sectional width that is smaller than a width of the opening of gland 202. In an embodiment, the cross-sectional width of retention segment at seal body 206 can be between 5% and 15% smaller than the cross-sectional width of the opening of gland 202. A portion of retention segment 210 can be configured to be inserted into gland 202. The portion of retention segment 210 configured to be inserted to gland 202 can have a cross-sectional width that is approximately equal to the cross-sectional width of the gland 202 at a depth corresponding to the position of the retention segment 210 when the gasket 204 is inserted into gland 202. In an embodiment, the retention segment 210 forms at least one half of the overall length of the retention projection 208. In an embodiment, the retention segment 210 has a length that is at least twice the length of the compression relief segment 212.

Compression relief segment 212 is a segment of the retention projection 208 that extends from the retention segment 210 to the bead 214. The compression relief segment 212 is a segment of the retention projection 208 having a cross-sectional thickness that is smaller than a cross-sectional width of the gland 202 at a corresponding depth. In an embodiment for a gland 202 having a typical width for a standard FOUP design, the compression relief segment 212 has a thickness approximately 0.15 mm smaller than a thickness of the retention segment 210. In an embodiment, a length of the compression relief segment 212 is less than or equal to half a length of the length of the retention segment 210.

Bead 214 is provided at an end of retention projection 208, at an end of compression relief segment 212 opposite where compression relief segment 212 meets retention segment 210. The bead 214 is a portion of retention projection 208 that is configured to be insertable into gland 202 and form an interference with gland 202. Bead 214 includes a tip 216 having a cross-sectional width smaller than an opening of gland 202 such that the tip 216 can be guided into the gland 202. The bead 214 further includes at least an interference fit portion 218 having a cross-sectional width greater than a cross-sectional width of a corresponding depth within gland 202. The interference fit portion 218 can include a widest point of the bead 214 with respect to the cross-sectional width. The bead can include any suitable geometry, such as rounding or tapering, as it extends from tip 216 to the interference fit portion 218. The interference fit portion 218 can be sized such that it is compressed by the walls of gland 202 when the retention projection 208 is inserted into gland 202. In an embodiment, the interference fit portion 218 has or includes a widest point having a cross-sectional width that is between 5% and 12% larger than the cross-sectional width of the gland at a corresponding depth in the gland. In an embodiment configured for use with a standard FOUP design, the interference fit portion 218 has a cross-sectional width that is approximately 0.15 mm larger than the cross-sectional width of the gland at a corresponding depth in the gland. In an embodiment, the bead 214 has a rounded shape, the rounded shape having a diameter corresponding to the maximum cross-sectional width of the interference fit portion 218. In an embodiment, bead 214 can be disposed with respect to the compression relief segment 212 such that the interference fit portion 218 is continuous with the line formed by compression relief segment 212 on one side, and interference fit portion 218 extends outwards with respect to a side opposite said one side of the compression relief segment. In an embodiment, bead 214 is disposed with respect to the compression relief segment 212 such that interference fit portion 218 extends outwards with respect to both sides of compression relief segment 212 when viewed in cross-section. Further non-limiting examples of bead 214 are included in the retention projections 300 and 400 shown in FIGS. 3 and 4 and described below. Compression of the interference fit portion 218 of bead 214 can cause swelling in some or all of the retention projection 208 to form an interference fit with gland 202 to retain gasket 204 within gland 202 and form a seal restricting flow from one side of gland 202 to an opposite side of gland 202 when the door 200 is joined to a wafer container.

Retention projection 208 including the retention segment 210, compression relief segment 212 and bead 214 can provide a relatively large retention force compared to the insertion force of the gasket 204. The retention force is a quantity of force needed to remove gasket 204 from the gland 202. The insertion force is a quantity of force required to fully insert gasket 204 into gland 202. In an embodiment, the ratio of the retention force to insertion force can be in a range from 0.5 to 1.0. In comparison, standard gasket designs for wafer containers provide ratios of retention force from approximately 0.25 to approximately 0.35. Accordingly, gasket 204 can allow for easier assembly and/or provide stronger retention of the gasket 204 within gland 202 compared to standard gasket designs.

Gaskets including a retention projection 208 were prepared. Three embodiments, each including the retention segment 210, compression relief segment 212, and a bead 214 were prepared. The bead geometry and the relative lengths of each segment were consistent across the three embodiments. The only variations across the example embodiments were changes to the cross-sectional widths of one or more segments of the retention projection. In the Embodiments shown in Table 1, Embodiment 2 is 0.05 mm, or approximately 2.5% larger in cross-sectional width at the retention segment and the bead when compared to Embodiment 1. Embodiment 3 has the same cross-sectional width as Embodiment 1 at the retention segment, and a bead having a cross-sectional width that is 0.1 mm, or approximately 5% larger than that of Embodiment 1. The force, in Newtons, required to fully insert each embodiment into a gland of a corresponding wafer container door was measured, and is recorded in Table 1 as the Insertion value. The force, in Newtons, required to remove a fully inserted embodiment from the gland was then measured, and is recorded in Table 1 as the Retention value. A ratio of the retention value divided by the insertion value is provided as the Ratio value. The same testing for insertion and retention forces was then performed for a product of record (POR) currently used as a seal for wafer container doors. The POR has sloping walls shaped to correspond to the shape of the gland without a distinct compression relief segment or a bead as in Embodiments 1-3.

TABLE 1

Insertion and Retention

| Design | Insertion | Retention | Ratio |
| --- | --- | --- | --- |
| Embodiment 1 | 41 | 33.55 | 0.818292683 |
| Embodiment 2 | 34.2 | 32.63 | 0.954093567 |
| Embodiment 3 | 52.4 | 32.53 | 0.620801527 |
| POR | 56.1 | 14.20 | 0.253172305 |

As can be seen in Table 1, while the ratio of retention force to compression force varies across embodiments as the particular cross-sectional widths of segments are varied, it is significantly greater in all of the embodiments when compared to the POR, due at least in part to the particular inclusion and arrangement of the compression relief segment and the bead.

Further, gasket 204 can provide a stronger seal compared to standard gasket designs when door 200 is joined to a wafer container. For example, the conductance through a door according to an embodiment attached to a wafer container can be 0.02 or less.

FIG. 3 shows a retention projection of a gasket according to an embodiment. Gasket 300 includes seal body 302 and retention projection 304. The retention projection 304 includes retention segment 306, compression relief segment 308, and bead 310. In the embodiment shown in FIG. 3, the bead 310 includes tip 312 and interference fit portion 314. The cross-sectional profile of bead 310 can be, for example, generally rhomboid while having rounded corners. Interference fit portion 314 includes interference fit projection 316 extending outwards relative to a first side 318 of the retention projection 304. In gasket 300, the second side 320, opposite first side 318, has a continuous taper over the length of the retention projection 304.

FIG. 4 shows a retention projection of a gasket according to an embodiment. Gasket 400 includes seal body 402 and retention projection 404. The retention projection 404 includes retention segment 406, compression relief segment 408, and bead 410. In the embodiment shown in FIG. 4, the bead 410 includes tip 412 and interference fit portion 414. Bead 410 has a generally circular cross-sectional profile. In gasket 400, the generally circular cross-sectional profile of bead 410 is shaped and its center offset such that the first side 418 of retention projection 404 has a continuous taper over the length of the retention projection 404. Interference fit portion 414 includes interference fit projection 416 extending outwards relative to a second side 420, the second side 420 being opposite first side 418 of the retention projection 404. In the embodiment shown in FIG. 4, the gasket 400 is inserted into a gland 422. When gasket 400 is inserted into gland 422, retention segment 406 and bead 410 are compressed, with the compression relief segment 408 swelling to also fill the gland 422 by the compression of the surrounding material at retention segment 406 and bead 410.

Aspects:

It is understood that any of aspects 1-9 can be combined with any of aspects 10-18.

Aspect 1. A door for a wafer container, comprising:
a door plate including a gland configured to receive a portion of a gasket; and
a gasket including a compressible material, the gasket including:
a seal body; and
a retention projection, the retention projection comprising:
a retention segment extending from the seal body, the retention segment having a cross-sectional width equal to or less than a cross-sectional width of the gland at a corresponding depth in the gland;
a compression relief segment extending from the retention segment, the compression relief segment having a cross-sectional width less than a cross-sectional width of the retention segment; and
a bead disposed at an end of the compression relief segment, the bead having a maximum cross-sectional width greater than a cross-sectional width of the gland at a corresponding depth in the gland.

Aspect 2. The door according to aspect 1, wherein the gasket has a retention force to insertion force ratio of 0.5 to 1.0, the retention force being a force required to remove the gasket from the gland, the insertion force being a force required to fully insert the retention projection into the gland.

Aspect 3. The door according to any of aspects 1-2, wherein when the door is attached to a wafer container, a conductance through the door joint is less than 0.02.

Aspect 4. The door according to any of aspects 1-3, wherein the retention segment forms at least one half of the length of the retention projection.

Aspect 5. The door according to any of aspects 1-4, wherein the retention segment has a length that it at least twice a length of the compression relief segment.

Aspect 6. The door according to any of aspects 1-5, wherein the gasket is formed of a thermoplastic elastomer having a Shore A hardness of 50-80 durometer.

Aspect 7. The door according to any of aspects 1-6, wherein the cross-sectional width of the retention segment is between 5% and 15% smaller than the cross-sectional width of the gland where the retention segment meets the seal body.

Aspect 8. The door according to any of aspects 1-7, wherein the cross-sectional width of the bead at a widest point is between 5% and 12% larger than the cross-sectional width of the gland at a corresponding depth in the gland.

Aspect 9 The door according to any of aspects 1-8, wherein the cross-sectional width of the compression relief segment that is between 5% and 15% smaller than a cross-sectional width of the retention segment.

Aspect 10. A front opening wafer container comprising:
a container body having an open front, the open front defined by a door frame;
a door configured to be attached to the door frame, the door including:
a door plate including a gland configured to receive a portion of a gasket; and
a gasket including a compressible material, the gasket including:
a seal body; and
a retention projection, the retention projection comprising:
a retention segment extending from the seal body, the retention segment having a cross-sectional width equal to or less than a cross-sectional width of the gland at a corresponding depth in the gland;
a compression relief segment extending from the retention segment, the compression relief segment having a cross-sectional width less than a cross-sectional width of the retention segment; and
a bead disposed at an end of the compression relief segment, the bead having a maximum cross-sectional width greater than a cross-sectional width of the gland at a corresponding depth in the gland, wherein the gasket is configured to form a seal between the door and the door frame.

Aspect 11. The front opening wafer container according to aspect 10, wherein the gasket has a retention force to insertion force ratio of 0.6 to 1.0.

Aspect 12. The front opening wafer container according to any of aspects 10-11, wherein when the door is attached to a wafer container, a conductance through the door joint is less than 0.02.

Aspect 13. The front opening wafer container according to any of aspects 10-12, wherein the retention segment forms at least one half of the length of the retention projection.

Aspect 14. The front opening wafer container according to any of aspects 10-13, wherein the retention segment has a length that it at least twice a length of the compression relief segment.

Aspect 15. The front opening wafer container according to any of aspects 10-14, wherein the gasket is formed of a thermoplastic elastomer having a Shore A hardness of 60 to 90 durometer.

Aspect 16. The front opening wafer container according to any of aspects 10-15, wherein the cross-sectional width of the retention segment is between 5% and 15% smaller than the cross-sectional width of the gland where the retention segment meets the seal body.

Aspect 17. The front opening wafer container according to any of aspects 10-16, wherein the cross-sectional width of the bead at a widest point is between 5% and 12% larger than the cross-sectional width of the gland at a corresponding depth in the gland.

Aspect 18. The front opening wafer container according to any of aspects 10-17, wherein the cross-sectional width of the compression relief segment that is between 5% and 15% smaller than a cross-sectional width of the retention segment.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A door for a wafer container, comprising:
a door plate including a gland configured to receive a portion of a gasket; and
a gasket including a compressible material, the gasket including:
a seal body; and
a retention projection, the retention projection comprising:

a retention segment extending from the seal body, the retention segment having a cross-sectional width equal to or less than a cross-sectional width of the gland at a corresponding depth in the gland;

a compression relief segment extending from the retention segment, the compression relief segment having a cross-sectional width less than a cross-sectional width of the retention segment; and a bead disposed at an end of the compression relief segment, the bead having a maximum cross-sectional width greater than a cross-sectional width of the gland at a corresponding depth in the gland.

2. The door of claim 1, wherein the gasket has a retention force to insertion force ratio of 0.5 to 1.0, the retention force being a force required to remove the gasket from the gland, the insertion force being a force required to fully insert the retention projection into the gland.

3. The door of claim 1, wherein when the door is attached to a wafer container, a conductance through the door joint is less than 0.02 L/s/atm.

4. The door of claim 1, wherein the retention segment forms at least one half of the length of the retention projection.

5. The door of claim 1, wherein the retention segment has a length that is at least twice a length of the compression relief segment.

6. The door of claim 1, wherein the gasket is formed of a thermoplastic elastomer having a Shore A hardness of 50-80 durometer.

7. The door of claim 1, wherein the cross-sectional width of the retention segment is between 5% and 15% smaller than the cross-sectional width of the gland where the retention segment meets the seal body.

8. The door of claim 1, wherein the cross-sectional width of the bead at a widest point is between 5% and 12% larger than the cross-sectional width of the gland at a corresponding depth in the gland.

9. The door of claim 1, wherein the cross-sectional width of the compression relief segment that is between 5% and 15% smaller than a cross-sectional width of the retention segment.

10. A front opening wafer container comprising:
    a container body having an open front, the open front defined by a door frame;
    a door configured to be attached to the door frame, the door including:
        a door plate including a gland configured to receive a portion of a gasket; and
        a gasket including a compressible material, the gasket including:
            a seal body; and
            a retention projection, the retention projection comprising:
                a retention segment extending from the seal body, the retention segment having a cross-sectional width equal to or less than a cross-sectional width of the gland at a corresponding depth in the gland;
                a compression relief segment extending from the retention segment, the compression relief segment having a cross-sectional width less than a cross-sectional width of the retention segment; and
                a bead disposed at an end of the compression relief segment, the bead having a maximum cross-sectional width greater than a cross-sectional width of the gland at a corresponding depth in the gland,
    wherein the gasket is configured to form a seal between the door and the door frame.

11. The front opening wafer container of claim 10, wherein the gasket has a retention force to insertion force ratio of 0.6 to 1.0.

12. The front opening wafer container of claim 10, wherein when the door is attached to a wafer container, a conductance through the door joint is less than 0.02 L/s/atm.

13. The front opening wafer container of claim 10, wherein the retention segment forms at least one half of the length of the retention projection.

14. The front opening wafer container of claim 10, wherein the retention segment has a length that it is at least twice a length of the compression relief segment.

15. The front opening wafer container of claim 10, wherein the gasket is formed of a thermoplastic elastomer having a Shore A hardness of 60 to 90 durometer.

16. The front opening wafer container of claim 10, wherein the cross-sectional width of the retention segment is between 5% and 15% smaller than the cross-sectional width of the gland where the retention segment meets the seal body.

17. The front opening wafer container of claim 10, wherein the cross-sectional width of the bead at a widest point is between 5% and 12% larger than the cross-sectional width of the gland at a corresponding depth in the gland.

18. The front opening wafer container of claim 10, wherein the cross-sectional width of the compression relief segment that is between 5% and 15% smaller than a cross-sectional width of the retention segment.

* * * * *